United States Patent
Walke et al.

(10) Patent No.: US 10,347,536 B2
(45) Date of Patent: Jul. 9, 2019

(54) SEMI-SEQUENTIAL 3D INTEGRATION

(71) Applicant: IMEC VZW, Leuven (BE)

(72) Inventors: Amey Mahadev Walke, Heverlee (BE); Nadine Collaert, Blanden (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/203,605

(22) Filed: Nov. 28, 2018

(65) Prior Publication Data

US 2019/0096764 A1    Mar. 28, 2019

Related U.S. Application Data

(62) Division of application No. 15/685,137, filed on Aug. 24, 2017, now Pat. No. 10,163,714.

(30) Foreign Application Priority Data

Sep. 2, 2016  (EP) .................................... 16187075

(51) Int. Cl.

| H01L 21/822 | (2006.01) |
|---|---|
| H01L 21/8238 | (2006.01) |
| H01L 27/06 | (2006.01) |
| H01L 27/092 | (2006.01) |
| H01L 23/535 | (2006.01) |
| H01L 21/84 | (2006.01) |
| H01L 27/088 | (2006.01) |
| H01L 27/12 | (2006.01) |
| H01L 27/02 | (2006.01) |

(52) U.S. Cl.
CPC .. *H01L 21/8221* (2013.01); *H01L 21/823871* (2013.01); *H01L 21/84* (2013.01); *H01L 23/535* (2013.01); *H01L 27/0694* (2013.01); *H01L 27/088* (2013.01); *H01L 27/092* (2013.01); *H01L 27/1203* (2013.01); *H01L 27/0207* (2013.01)

(58) Field of Classification Search
CPC ......... H01L 21/8221; H01L 21/823871; H01L 21/84
See application file for complete search history.

(56) References Cited

U.S. PATENT DOCUMENTS

| 2001/0000017 A1* | 3/2001 | Kanetani ............ H03K 19/0963 326/93 |
|---|---|---|
| 2010/0140710 A1 | 6/2010 | Kuroda |
| 2014/0145272 A1 | 5/2014 | Or-Bach et al. |
| 2014/0346624 A1 | 11/2014 | Shoji et al. |

* cited by examiner

*Primary Examiner* — Errol V Fernandes
(74) *Attorney, Agent, or Firm* — McDonnell Boehnen Hulbert & Berghoff LLP

(57) ABSTRACT

Disclosed herein is a semiconductor structure including: a host substrate and one or more bonding layers on top of the host substrate. The structure further includes an entity on the one or more bonding layers, where the entity includes two transistors on opposite sides of a common layer of channel material, where each transistor includes a gate, where both gates overlap each other, where both transistors share the same source and drain regions, and where each transistor have a channel defined within a same portion of the common layer of channel material overlapped by both transistor gates.

4 Claims, 14 Drawing Sheets

SEMI-SEQUENTIAL 3D INTEGRATION

CROSS-REFERENCE TO RELATED APPLICATIONS

The present application is a divisional patent application claiming priority to U.S. patent application Ser. No. 15/685,137 filed on Aug. 24, 2017, which claims priority to European Patent Application No. EP 16187075.3, filed Sep. 2, 2016, the contents of each of which are hereby incorporated by reference.

FIELD OF THE DISCLOSURE

The present disclosure relates to the field of integrated circuits and more in particular to the integration of transistors in three-dimensional integrated circuits.

BACKGROUND

Over the past decades, there has been a dramatic increase in functionality and performance of integrated circuits (ICs). This has largely been due to the phenomenon of "scaling"; i.e. component sizes within ICs have been reduced ("scaled") with every successive generation of technology. Two of the most important components in complementary metal oxide semiconductor (CMOS) ICs are transistors and wires. With "scaling", transistor density typically improves and this has contributed to the previously-mentioned increases in IC performance and functionality. However, wires (interconnects) that connect together semiconductor devices such as transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions (3D) instead of 2 dimensions (2D), the transistors in ICs can be placed closer to each other. This reduces wire lengths and keeps wiring delay low. Different techniques exist to construct 3D stacked integrated circuits or chips, including methods based on through-silicon via (TSV) technology and monolithic 3D technology. An example of monolithic 3D ICs is for example disclosed in US20140145272 A1.

However, regardless of the method used, known 3D ICs are essentially individual and distinct 2D transistor layers which are stacked atop one another and which are electronically coupled together by means of interconnects. There is thus still room for methods to provide a deeper integration of transistor layers in 3D ICs.

SUMMARY

It is an object of the present disclosure to provide methods and structures for improving the integration of transistors in ICs.

Embodiments of the present disclosure provide a compact integration of transistors in ICs. In particular, embodiments of the present disclosure provide transistors built opposite each other on both side of a common layer of channel material, thereby saving space. In such embodiments, the two transistors therein can share the same source and drain regions, thereby also saving space. Also, embodiments of the present disclosure can allow for short wire lengths.

In embodiments of the present disclosure, the source and drain electrodes can be connected from either above or below the common layer of channel material, thereby allowing more freedom in interconnect routing.

Furthermore, in embodiments of the present disclosure, the two transistors are bonded atop a host substrate that can include (pre-processed) semiconductor devices. Within examples, the methods disclosed herein do not require elevated temperatures after bonding since all high temperature steps have been performed before bonding, thereby not negatively impacting any semiconductor devices already present on the host substrate. In further examples, at least part of the interconnect wiring to the two transistors and/or to the optional semiconductor devices of the host substrate can be provided prior to bonding the donor substrate to the host substrate. As such, bonding alignment requirements for aligning (partial) interconnect wiring are typically considerably less critical than for aligning semiconductor devices.

The above objective is accomplished by methods and devices according to the present disclosure.

In a first aspect, the present disclosure relates to a method for forming two transistors on opposite sides of a common layer of channel material having a thickness. The method includes the step of: (a) providing a donor substrate, which includes a first semiconductor substrate and the common layer of channel material having an exposed first side. The method also includes the step of (b) forming a first transistor gate on the first side of the common layer of channel material, thereby defining a first channel within a portion of the common layer of channel material overlapped by the first transistor gate. The method further includes the step of (c) forming in the common layer of channel material: (i) a source region at a first end of the first channel and occupying the whole thickness of the common layer of channel material, and (ii) a drain region at a second end of the first channel, opposite to the first end, and occupying the whole thickness of the common layer of channel material. Further, the method includes the steps of (d) bonding the donor substrate to a host substrate, such that the common layer of channel material is present between the first semiconductor substrate and the host substrate, and (e) removing at least part of the donor substrate, so as to expose at least part of a second side of the common layer of channel material, opposite to the first side. Yet further, the method includes the step of (f) forming a second transistor gate on the second side of the common layer of channel material in such a way that the first transistor gate and the second transistor gate overlap and share the same source and drain regions, thereby defining a second channel within a portion of the common layer of channel material overlapped by both the first transistor gate and the second transistor gates.

In a second aspect, the present disclosure relates to a structure including: a host substrate and one or more bonding layers on top of the host substrate. The structure further includes an entity on the one or more bonding layers, the entity including two transistors on opposite sides of a common layer of channel material, each transistor including a gate, both gates overlapping each other, both transistors sharing the same source and drain regions, and each transistors having a channel defined within a same portion of the common layer of channel material overlapped by both transistor gates.

Particular and preferred aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

DETAILED DESCRIPTION

Figure 1A:
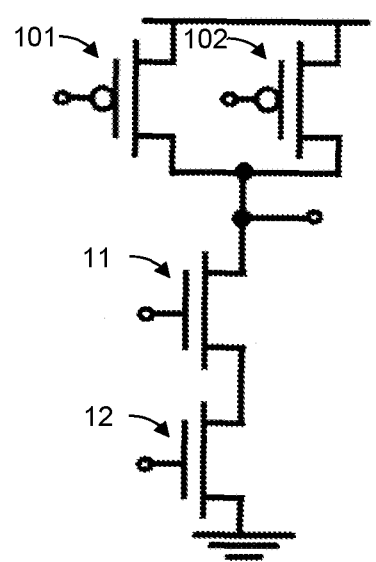
FIG. 1a illustrates a circuit diagram of a CMOS NAND (Not AND) gate, according to an exemplary embodiment.

The present disclosure will be described with respect to particular embodiments and with reference to certain drawings, but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Similarly, it is to be noticed that the term "coupled", should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Reference will be made to transistors. These are devices having a drain region, a source region and a gate for controlling the flow of electrical charges between the source and the drain regions. The source and drain regions, typically when having an electrical contact thereon, are also referred to as source and drain electrodes or source and drain terminals.

Figure 14:
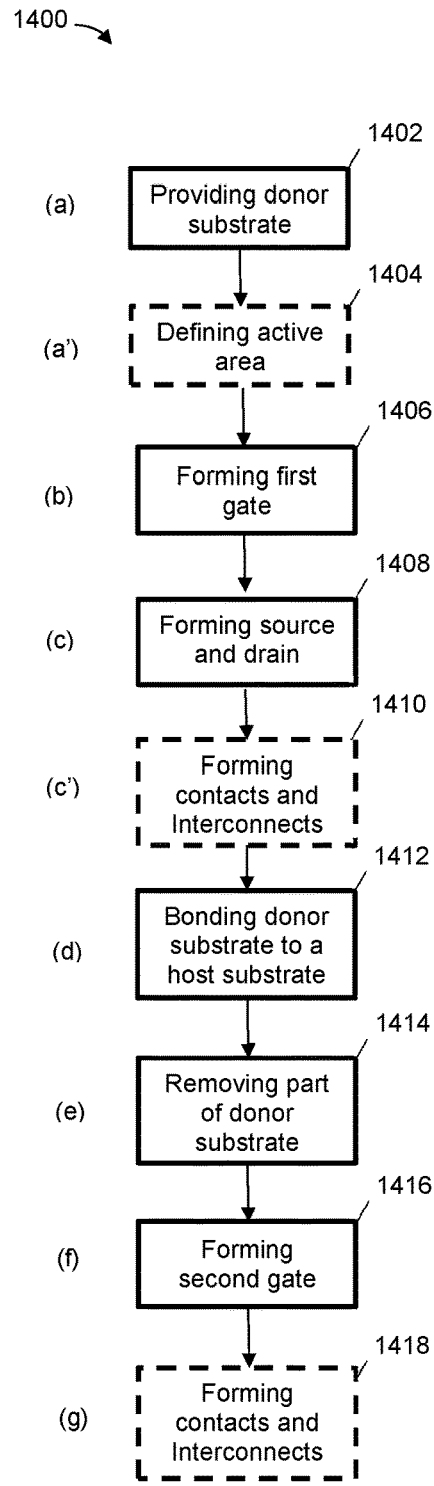
FIG. 14 is a flowchart illustrating the steps of a method, according to an exemplary embodiment.

In a first aspect, and as illustrated in FIG. 14 the present disclosure relates to a method 1400 for forming two transistors on opposite sides of a common layer of channel material having a thickness. The method 1400 includes a step 1402 of (a) providing a donor substrate that includes a first semiconductor substrate and the common layer of channel material, where the common layer has an exposed first side. The method also includes a step 1406 of (b) forming a first transistor gate on the first side of the common layer of channel material, thereby defining a first channel within a portion of the common layer of channel material overlapped by the first transistor gate. The method further includes a step 1408 of (c) forming in the common layer of channel material: (i) a source region at a first end of the first channel, and occupying the whole thickness of the common layer of channel material, and (ii) a drain region at a second end of the first channel, opposite to the first end, and occupying the whole thickness of the common layer of channel material. Further, the method includes a step 1412 of (d) bonding the donor substrate to a host substrate, such that the common layer of channel material is present between the first semiconductor substrate and the host substrate. Yet further, the method includes steps 1414 and 1416 of (e) removing part of the donor substrate, so as to expose at least part of a second side of the common layer of channel material, opposite to the first side; and (f) forming a second transistor gate on the second side of the common layer of channel material in such a way that the first transistor gate and the second transistor gate overlap and share the same source and drain regions, thereby defining a second channel within a portion of the common layer of channel material overlapped by the second transistor gate.

These steps of the method are represented in the flowchart of FIG. 14. Steps bordered with a dashed line are typically present but not essential for the definition of the present disclosure.

As illustrated in FIG. 14, step (b) is performed after step (a) and before step (d). Step (c) is performed after step (a) and before step (d). Typically, step (c) is performed after step (b). Step (d) is performed after steps (a), (b) and before step (e). Step (e) is performed after step (d) and before step (f). An example step order is (a), (b), (c), (d), (e), and (f).

The channel material is a material suitable to form a channel therein in a field-effect-transistor; such as a group IV semiconductor, e.g. Si or Ge, or a III-V material, e.g. InGaAs. The common layer of channel material has two opposite sides, typically a first (top) and a second (bottom) side, where two transistors are formed facing each other on either side of the common layer of channel material. In an example, the common layer of channel material may have a thickness of from 2 to 30 nm. The layer of channel material is said to be the common layer of channel material because both transistors will use that same layer of channel material for their respective channels.

In embodiments, the common layer of channel material may be patterned. For instance, device active areas may be isolated from one another by etching a pattern and depositing a dielectric in the pattern. For instance, the area where both transistors are formed may be isolated from other transistors formed on the common layer of channel material by using such a patterning.

The donor substrate comprises the common layer of channel material and a first semiconductor substrate. The first semiconductor substrate may be a group IV substrate such as a Si or a Ge substrate or a group III-V substrate such as a GaAs or InP substrate. In embodiments, the first semiconductor substrate may be comprised in a semiconductor-on-insulator type substrate such as a Si-on-insulator or a Ge-on-insulator substrate. For instance, the first semiconductor substrate may be a group IV wafer such as a Si or a Ge wafer, a group III-V wafer such as a GaAs or InP wafer, or may be comprised in a semiconductor-on-insulator type wafer such as a Si-on-insulator, Ge-on-insulator, SiGe-on-insulator or III-V-on-insulator wafer. In embodiments, the donor substrate may comprise an etch stop layer between the layer of channel material and the semiconductor substrate. In some embodiments, as explained below, the etch stop layer facilitates the removal, in step e, of part of the donor substrate. The etch stop layer is typically such that it can resist etching in at least one chemistry suitable for etching the semiconductor substrate and that it can be etched selectively by at least one chemistry with respect to the common layer of channel material. The presence of an etch stop layer is often advantageous because the semiconductor substrate (typically a Si wafer) and the channel layer (typically a Si channel layer) have often identical or similar compositions, making stopping the etching process exactly at the boundary between the semiconductor substrate and the common channel layer challenging. The etch stop layer therefore helps to control the thickness and quality of the common channel layer. For the etch stop layer, the insulator (e.g. $SiO_2$) layer on a semiconductor-on-insulator wafer can for instance be used. In that case, the donor substrate would comprise a semiconductor-on-insulator wafer, consisting of a semiconductor substrate (the semiconductor wafer) and an etch stop layer (the insulator layer), and a channel layer overlying the etch stop layer. Another possibility for providing an etch stop layer is to grow an actual etch stop layer on a semiconductor wafer. For instance, SiGe can be grown on a Si wafer and serve as the etch stop layer. In that case, if the channel layer is Si, it can be strained. Another such example is the growth of an InP etch stop layer on a Si wafer. This last example permits to use a III-V channel layer such as an InGaAs channel layer.

In some embodiments, step (a) may include providing a donor substrate including a layer of channel material on a silicon-on-insulator (SOI) substrate. In that case, the insulator layer of the SOI substrate will serve as an etch stop layer.

In embodiments, the host substrate may comprise a second semiconductor substrate. The second semiconductor substrate may be a group IV substrate such as a Si or a Ge substrate, a group III-V substrate such as a GaAs or InP substrate, or a semiconductor-on-insulator type substrate such as a Si-on-insulator or a Ge-on-insulator substrate. For instance, the second semiconductor substrate may be a group IV wafer such as a Si or a Ge wafer, a group III-V wafer such as a GaAs or InP wafer, or a semiconductor-on-insulator type wafer such as a Si-on-insulator or a Ge-on-insulator wafer. In some embodiments, the host substrate may comprise a semiconductor device (e.g. one or more semiconductor devices such as one or more transistors), which may also be referred to as comprising a first front-end-of-line (FEOL). In some embodiments, the host substrate may comprise an electrical contact on the semiconductor device(s) and/or electrical interconnects to the semiconductor device(s), which may also be referred to as comprising a first (at least partial) back-end-of-line (BEOL). In some embodiments, the host substrate may comprise an at least partially preprocessed first front-end-of-line (FEOL)

and first back-end-of-line (BEOL) on top of a semiconductor substrate (e.g. a silicon wafer).

A first transistor is formed by forming, on a first side of the common layer of channel material (which can be referred to as the top side), a first transistor gate (which may also be referred to as a gate stack), thereby defining a first channel within a portion of the common layer of channel material overlapped by the first transistor gate, and, at opposite ends of the first channel, the source and drain regions. To this end, a step 1404 (a') may be performed between step a and step b, where transistor active areas are first defined using a process such as shallow trench isolation (STI), before subsequent deposition of a gate dielectric and a gate electrode (i.e., a gate or gate stack). This is in turn typically followed by patterning of the gate electrode and the gate dielectric. After formation of the first transistor gate stack, spacers may be formed to separate the gate from the source and the drain. The first transistor gate stack typically comprises a gate dielectric (e.g. a gate oxide comprising silicon and/or hafnium oxide) and a gate electrode. In embodiments, the first transistor gate may be formed through a gate replacement process. In such embodiments, a sacrificial dummy gate and dummy gate dielectric is used instead of an actual gate and gate dielectric. Next, spacers and source-drain implantation and dopant activation is done by annealing at elevated temperature or using laser energy. In addition to ion implantation, the source and drain could also be formed by in-situ doped epitaxial growth of a semiconductor material. After this, an interlayer dielectric is deposited and planarized until the dummy gate is exposed. The exposed dummy gate and gate dielectric are removed selectively and the final gate dielectric stack is deposited, which is then followed by the deposition and planarization of the metal gate stack.

After the first transistor is formed, the source, drain and gate may be contacted by forming vias in the interlayer dielectric layer and filling the vias with metal. This may be followed by formation of one or more interconnect layers. In an embodiment, the materials (dielectrics and metals) used for interconnects and contact are selected so that they can withstand subsequent processing from the back side. For example, using tungsten can typically allow temperature of ~500-600° C. for processing on the back side.

Typically, the first channel uses the surface area of the layer of channel material overlapped by the first transistor gate. Typically, the depth used by the first channel in the layer of channel material is less than half of the thickness of the common layer of channel material such that in the ON state, majority of the current flows near the gate dielectric-semiconductor interface of the first gate.

In embodiments, the method may include the additional step 1410 (c'), after step (b) and before step (d), of forming an electrical contact and, typically, interconnects on the first transistor. The electrical contact and interconnects may be referred to as being part of a second BEOL. Step (c') can be performed directly after step (b), after step (c), or partly after step (b) (contacts and interconnects to the gate) and partly after step (c) (contacts and interconnects to the source and drain).

Typically, step (c') includes forming electrical contacts on the gate, the source and the drain electrodes and forming interconnects to these contacts. Within embodiments, step c' is performed after steps (b) and (c) have been performed.

A second transistor is formed by bonding the donor substrate and the first transistor formed thereon to the host substrate, then removing at least part of the donor substrate (i.e., at least part of the first semiconductor substrate) and subsequently forming, on the second (opposite, which can also be referred to as the bottom or back) side of the common layer of channel material, the second transistor gate (i.e. gate stack), thereby defining the second channel in the common layer of channel material.

The second transistor gate typically includes a gate dielectric (e.g., a silicon and/or hafnium oxide) and a gate electrode. In embodiments, the second transistor gate may be formed through a gate replacement process analogous to the one used for the first gate dielectric.

Typically, the second channel uses the surface area of the layer of channel material overlapped by the second transistor gate. Typically, the depth used by the second channel in the layer of channel material is less than half of the thickness of the common layer of channel material. This permit both channels to share a same lateral portion of the common layer of channel material but different regions (different depth ranges) defined across the thickness of the common layer of channel material. Typically, in step f, the second channel is defined within a portion of the common layer of channel material overlapped by both the first transistor gate and the second transistor gate.

The first and second transistor gates may be directly opposite each other across the common layer of channel material. In embodiments, both transistor gates have the same lateral dimensions and are aligned one on top of the other so that they overlap (e.g., exactly overlap) with each other. The two transistors share the same source region and drain region. The first and second transistors may be referred to as being part of a second FEOL.

In any embodiment described herein, forming a source region and a drain region may comprise doping the common layer of channel material at the first and second ends of a channel. In embodiments, the doping may be performed by ion implantation. For instance, P-type implantation for forming the source and drain regions of one or more PMOS transistors may be performed. Also, N-type implantation for forming the source and drain regions of one or more NMOS transistors may be performed. Implantation can be restricted to the desired areas by use of a mask. In addition to ion implantation, forming the source and drain regions may involve epitaxially growing raised source and drain on either end of the channel.

Doping, e.g., by implantation, is typically followed by annealing at elevated temperatures (typically>600° C.). The doping can be performed prior to bonding so as to not negatively impact preprocessed semiconductor devices on the host substrate. Here, the use of laser annealing can minimize diffusion of dopants. Moreover, both first and second transistors share the same source and drain, which are formed prior to the bonding. Therefore, the thermal budget for formation of the second transistor is mainly limited to formation of the gate, the spacers and the contacts, which is relatively a low thermal budget process (<600° C.). Thus, the process will not have a negative impact on the first transistor or transistors on the host substrate.

Typically, the common layer of channel material provided in step (a) may have an exposed (first, top) surface, and the source and drain regions formed in step (c) may extend from the exposed surface to a surface opposite thereof (second, bottom or back).

Steps (a), (b), and (c) (and c' when present) lead to the formation of an entity that will be bonded to the host substrate.

In embodiments, the method may further comprise a step (c"), before step (d), of providing a bonding layer on top of the donor substrate, the host substrate or, in some embodiments, both the donor substrate and the host substrate. Providing a bonding layer on top of the host substrate can be done at any moment before step (d). Providing a bonding layer on top of the donor substrate is typically performed after that steps (a), (b), (c) and (c') have been performed. In embodiments, the bonding layer may be a dielectric layer (e.g. a $SiO_2$ layer). In step (d), the donor substrate and the host substrate may be bonded by joining both bonding layers.

A dielectric bonding layer can provide electrical isolation between the donor and host substrate. In embodiments, each bonding layer may comprise an oxide (e.g. $SiO_2$) or a nitride (e.g. SiCN).

In embodiments, during and after step (d), the host substrate may be kept at temperatures not exceeding 600° C. As such, embodiments of the present disclosure can allow the second transistor to be completed without exposing the host substrate to high temperatures during or after the bonding. Not exposing the host substrate to these high temperatures can allow semiconductor devices therein to not deteriorate and thus to remain functional.

In embodiments where the donor substrate includes an etch stop layer underlying the common layer of channel material (i.e. between the semiconductor substrate and the common layer of semiconductor material), step e may include: removing at least part of the first semiconductor substrate, so as to expose at least part of the etch stop layer; and removing at least part of the etch stop layer, so as to expose at least part of the second side of the common layer of channel material.

In embodiments, the method may include the additional step (g), after step (f), of forming an electrical contact and interconnects on the second transistor gate. The electrical contact and the interconnects may be referred to as being part of the second BEOL.

Typically, step 1418 (g) includes forming electrical contacts on the gate, source and drain electrodes and forming interconnects to these contacts.

In embodiments where the host substrate includes an electrical contact on the semiconductor device, the method may include the additional step of forming an electrical interconnect to the electrical contact across the common layer of channel material. The electrical interconnect may be referred to as being part of the second BEOL. For instance, an electrical contact may be formed between a semiconductor device present in the second BEOL and a semiconductor device present in the first BEOL.

In embodiments, the method according to the first aspect may be repeated one or more times while using the structure obtained after the last performed step of the method (e.g. step g) as the host substrate for the next performed step (d).

In embodiments, the method leads to the formation of a structure that is part of a logic or memory semiconductor circuit. In an embodiment, the structure may be part of a NAND or NOR semiconductor circuit, e.g., a 3D NAND semiconductor circuit.

In embodiments, the first and second transistors are two transistors of a first polarity connected mutually in parallel. In such embodiments, it is possible to form a NAND or NOR semiconductor circuit by further forming in the second FEOL two further transistors of an opposite second polarity, via the formation of two further transistor gates on the first side of the common layer of channel material, thereby defining two further channels within two further portions of the common layer of channel material overlapped by the two further transistor gates. In that case, a source and a drain region can be formed at opposite ends of each of the further channels. Further, the two further transistors can be connected mutually in series and can be connected in series to the two transistors of a first polarity. This corresponds to a NAND or NOR scheme. For instance, the first and second transistors may be two PMOS transistors connected mutually in parallel. In such embodiments, the second FEOL further can comprise two NMOS transistors connected mutually in series and connected in series to the two parallel PMOS transistors. In this embodiment, the two NMOS transistors, through the formation of corresponding transistor gates and source/drain regions, are formed on the first side of the common layer of channel material before bonding. This corresponds to a NAND circuit scheme.

Alternatively, the first and second transistors may be two NMOS transistors (connected mutually in parallel). In such embodiments, the second FEOL can further comprise two PMOS transistors connected mutually in series and connected in series to the two parallel NMOS transistors. This corresponds to a NOR circuit scheme.

In the above NAND and NOR schemes, the parallel transistors share source and drain and two gates are used independently. In another scheme, it is also possible, during step (g), to connect the gates of the two parallel transistors to each other thereby operating it as a double gate transistor. Such a double gate configuration offers as much as double the current for a same area. For example, an inverter circuit could be implemented with both NMOS and PMOS having parallel transistors with gate connected to each other. Such a double gate inverter can provide a higher drive current than a single NMOS, single PMOS inverter with the same width of the semiconductor channel.

In embodiments, the entity may further comprise a second BEOL.

The ability to form contacts and corresponding interconnects both at the bottom and at the top side of the common layer of channel material may be used for an improved wire routing, e.g., wire routing in the second BEOL.

Electrical isolation between the different components, e.g., between, on one hand, both transistors of a first polarity connected mutually in parallel, and on another hand, the two transistors of an opposite polarity connected mutually in series may be provided by one or more dielectric regions formed in the common layer of channel material.

Interconnects present at different levels of the structure (e.g., in the first BEOL and the second BEOL) may be coupled by vias.

Figures 2A, 2B:
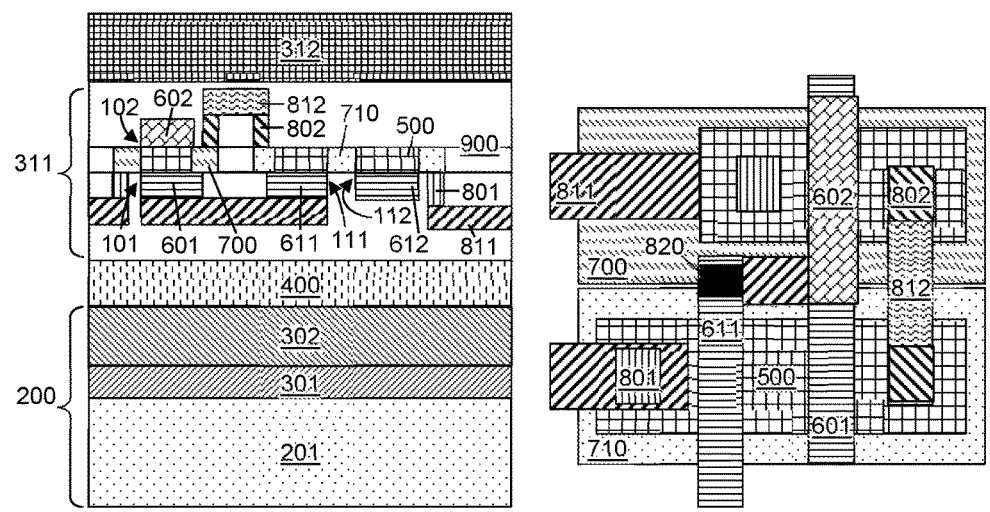
FIG. 2a illustrates a schematic representation of a side view of a 3D NAND semiconductor device, according to an exemplary embodiment.
FIG. 2b illustrates a schematic representation of a top view of a 3D NAND semiconductor device, according to an exemplary embodiment.

The first and second BEOL may therefore be coupled by a via (e.g., via 820 illustrated in FIG. 2b). Vias may also be used to couple earlier formed interconnects below the channel material to later formed interconnects above the channel material.

In a second aspect, the present disclosure relates to a structure obtainable by any embodiment of the first aspect of the present disclosure.

In an embodiment of the second aspect, and as illustrated in FIGS. 2a and 2b, the present disclosure relates to a structure comprising: a host substrate 200; one or more bonding layers 400 on top of the host substrate 200; and an entity on the one or more bonding layers 400, the entity comprising two transistors 101, 102 on opposite sides of a common layer of channel material 500, each transistor comprising a gate 601, 602, both gates 601, 602 overlapping each other, both transistors sharing the same source and drain regions 700, and each transistor having a channel defined within a same portion of the common layer of channel material 500 overlapped by both transistor gates 601, 602.

Typically, the first and second transistor gate may be directly opposite each other across the common layer of channel material.

In embodiments, the first and second transistor gates may have the same lateral dimensions and may be directly opposite each other across the common layer of channel material.

In embodiments, the host substrate may include a semiconductor device.

In embodiments, the structure may be part of a logic or memory semiconductor circuit such as a NAND, a NOR, or an Inverter semiconductor circuit.

In embodiments, the host substrate may comprise an (at least partially preprocessed) first front-end-of-line (FEOL) and first back-end-of-line (BEOL) on top of a semiconductor substrate (e.g. a silicon wafer).

In embodiments, the entity is bonded on the host substrate by means of a bonding layer, such as a bonding oxide (e.g. a $SiO_2$ layer).

The entity includes a second FEOL. The second FEOL includes both transistors. In embodiments, the first and second transistors are two transistors of a first polarity connected mutually in parallel. In these embodiments, the FEOL may further include two transistors of an opposite polarity connected mutually in series and connected in series to the two transistors of a first polarity. This may correspond to either a NAND or a NOR scheme. For instance, the first and second transistors may be two PMOS transistors connected mutually in parallel. In such embodiments, the FEOL may further include two NMOS transistors connected mutually in series and connected in series to the two PMOS transistors. This corresponds to a NAND circuit configuration. In this embodiment, the two NMOS transistors, through the formation of corresponding transistor gates and source/drain regions, are formed on the first side of the common layer of channel material.

Alternatively, the first and second transistors may be two NMOS transistors (connected mutually in parallel). In such embodiments, the FEOL may further include two PMOS transistors connected mutually in series and connected in series to the two NMOS transistors. This corresponds to a NOR circuit configuration.

In embodiments, the entity may further include a second BEOL.

The ability to form contacts and corresponding interconnects both at the bottom and at the top side of the common layer of channel material may be used for an improved or efficient wire routing, e.g., in the second BEOL.

Electrical isolation between the different components, e.g. between both transistors of a first polarity connected mutually in parallel on one hand and the two transistors of an opposite polarity connected mutually in series on another hand may be provided by one or more dielectric regions formed in the common layer of channel material.

Interconnects present at different levels of the structure (e.g., in the first BEOL and the second BEOL) may be coupled by vias.

In embodiments, the host substrate, the bonding layer, and the entity (both transistors (the first transistor and the second transistor), both transistor gates (the first transistor gate and the second transistor gate), the common layer of channel material, etc.) may each independently be in accordance with the corresponding features of any embodiment of the first aspect.

The disclosure will now be described by a detailed description of several embodiments of the disclosure. It is clear that other embodiments of the disclosure can be configured according to the knowledge of the person skilled in the art without departing from the true technical teaching of the disclosure, the disclosure being limited only by the terms of the appended claims.

It will be clear for a person skilled in the art that the present disclosure is also applicable to similar devices that can be configured in any transistor technology, including for example, but not limited thereto, CMOS, BICMOS, Bipolar and SiGe BICMOS technology. Furthermore, the findings of the present disclosure are explained with reference to PMOS and NMOS transistors as an example, but the present disclosure includes within its scope a complementary device whereby PMOS and NMOS transistors become NMOS and PMOS transistors, respectively. A skilled person can make such modifications without departing from the true technical teachings of the disclosure.

Figure 1B:
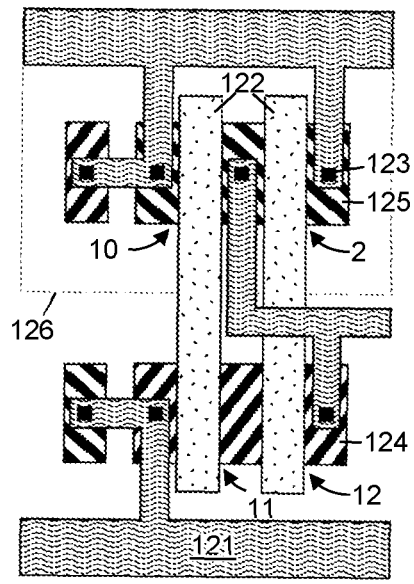
FIG. 1b illustrates the physical layout of a NAND 2D semiconductor device, according to an exemplary embodiment.

A. A Comparison Between a Traditional NAND Gate and a NAND Gate According to an Embodiment of the Present Disclosure We now refer to FIGS. 1a and 1b. FIG. 1a depicts a circuit diagram of a traditional CMOS NAND (Not AND) gate, including two parallel PMOS transistors 10, 2 and two NMOS transistors 11, 12 in series. The physical layout of a corresponding existing 2D semiconductor device is depicted in FIG. 1b. The 2D semiconductor device may typically include metal regions 121, poly regions 122, contacts 123, n-type 124 and p-type 125 diffusion regions, and an n-type well region 126.

We now refer to FIGS. 2a and 2b. A schematic representation of a side (FIG. 2a) and top (FIG. 2b) view of a 3D NAND semiconductor device, according to an embodiment of the present disclosure, is depicted in FIGS. 2a and 2b. It should be noted that the order of layers and structures, as they appear in FIG. 2b, is altered so as to not obscure them behind other layers or structures. A host substrate 200 may include an at least partially preprocessed first front-end-of-line (FEOL) 301 and first back-end-of-line (BEOL) 302 on top of, e.g., a silicon wafer 201. Bonded thereon by means of a bonding oxide 400 is a second FEOL 311 and BEOL 312. The second FEOL 311 includes two parallel PMOS transistors 101, 102 and two NMOS transistors 111, 112 in series. The two parallel PMOS transistors 101, 102 are formed on opposite sides of a common channel material 500, through the formation of two transistor gates 601, 602 thereon. The two parallel PMOS transistors 101, 102 further share the same source and drain regions 700, which can be formed by implantations. In this example, the two NMOS transistors 111, 112, through the corresponding transistor gates 611, 612 and source/drain regions 710, are formed on a first side of the channel material 500. The ability to form contacts 801, 802 and corresponding interconnects 811, 812 both at the first 801, 811 and at the second 802, 812 side is used for an improved wire routing, e.g., in the second BEOL 312. Electrical isolation between the different components is provided by one or more dielectrics 900. Interconnects at different levels of the structure are coupled by vias 820 (not shown in FIGS. 2a and 2b but shown in FIG. 13).

B. Fabrication of a Semiconductor Structure in Accordance with an Embodiment of the Present Disclosure The present example explains how to implement parallel and series transistor.

Figure 3:
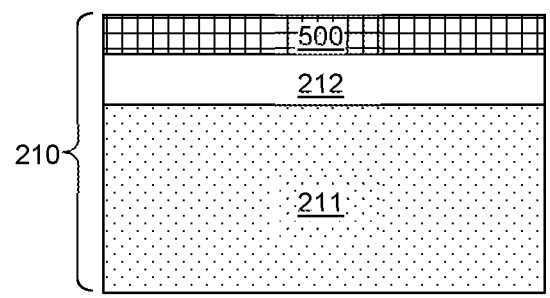
FIGS. 3, 4, 5, 6, 7, 8, 9, 10, 11, 12, and 13 each illustrate steps in the fabrication of a semiconductor structure, in according to an exemplary embodiment.

We now refer to FIG. 3. A donor substrate 210 including a layer of channel material 500 on a silicon-on-insulator (SOI) substrate 211, 212, is provided. The insulator layer 212 of the SOI substrate will serve as an etch stop layer 212.

Figure 4:
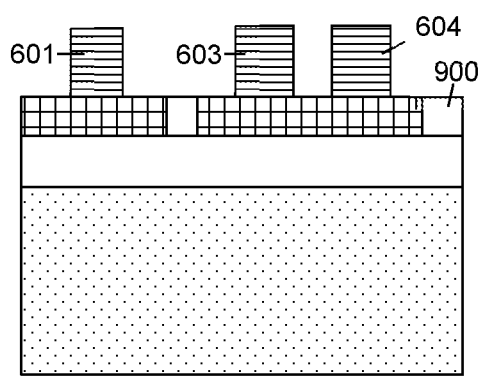

We now refer to FIG. 4. Device active areas are isolated by etching a pattern and depositing a dielectric 900 in the pattern. Furthermore, transistor gates 601, 603, 604 are formed.

Figure 5:
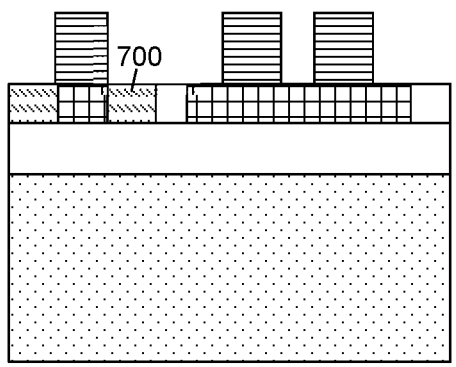

We now refer to FIG. 5. P-type implantation for forming the source and drain regions 700 of one or more PMOS is performed. Implantation can be restricted to the desired areas by use of a mask.

Figure 6:
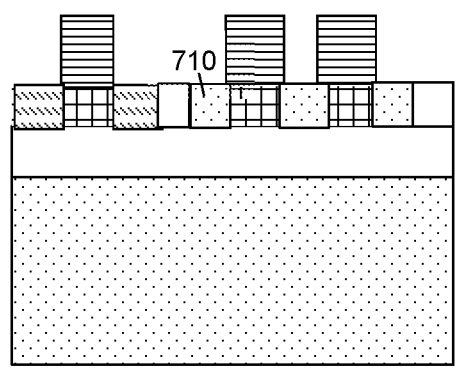

We now refer to FIG. 6. N-type implantation for forming the source and drain regions 710 of one or more NMOS is performed. Implantation can be restricted to the desired areas by use of a mask.

Figure 7:
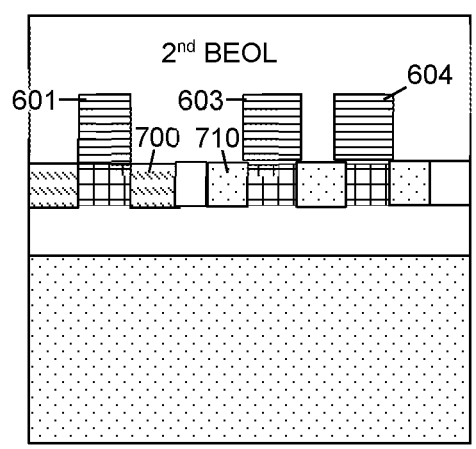

We now refer to FIG. 7. Some of the contacts (not shown but as presented in FIG. 2a) and interconnects (not shown but as presented in FIG. 2a) to the transistor gates 601, 603, 604 and source/drain regions 700, 710 are formed.

Figure 8:
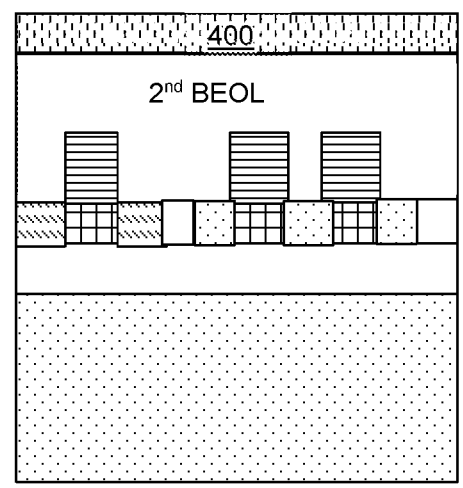
Figure 8:
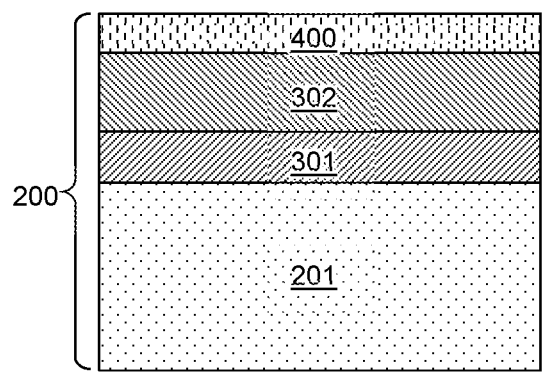

We now refer to FIG. 8. At the top of FIG. 8, a bonding layer 400, e.g., a bonding oxide, is deposited. At the bottom of FIG. 8, a host substrate 200, for example including an at least partially preprocessed first FEOL 301 and first BEOL 302 on a second semiconductor substrate 201, and a bonding layer 400 thereon is also provided.

Figure 9:
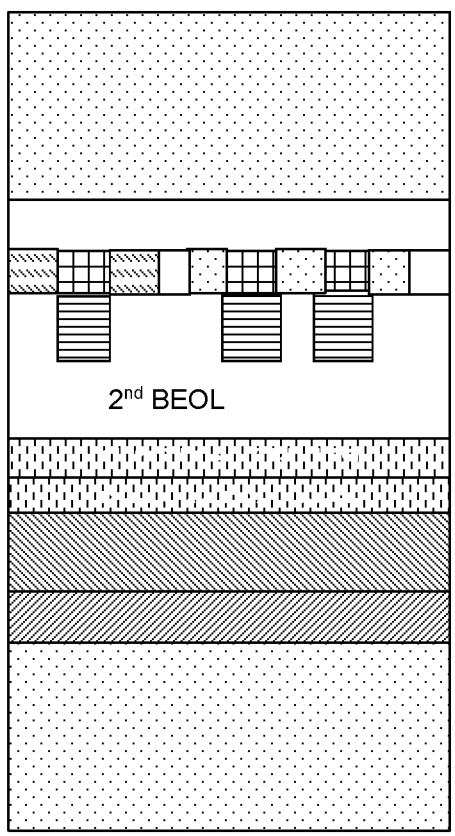

We now refer to FIG. 9. The donor substrate is flipped and both substrates are bonded by joining both bonding layers 400.

Figure 10:
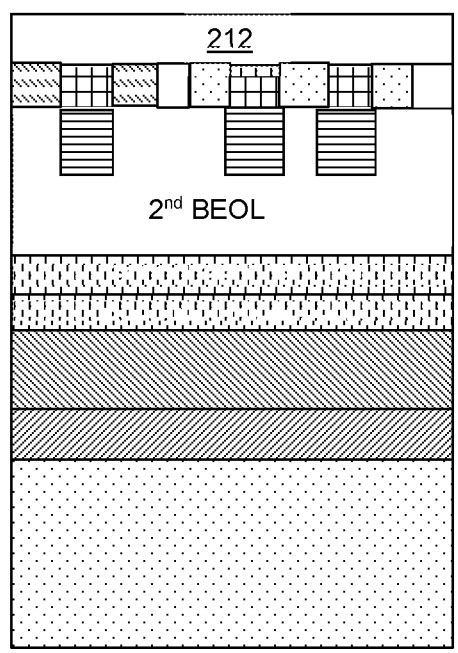

We now refer to FIG. 10. The donor substrate 210 is partially removed, for example by etching the substrate down to the etch stop layer 212.

Figure 11:
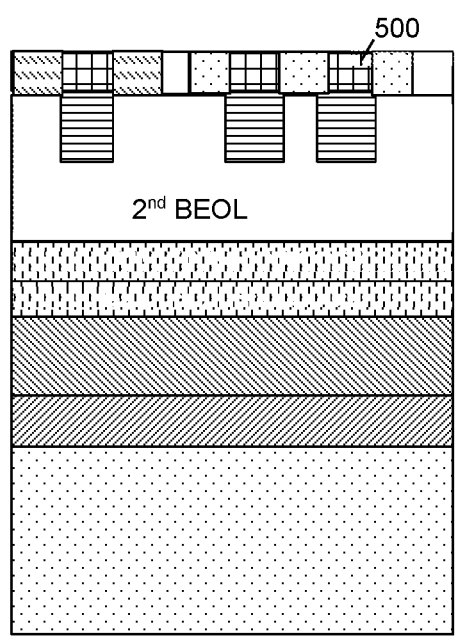

We now refer to FIG. 11. The etch stop layer 212 is removed selectively and the channel material 500 is exposed.

Figure 12:
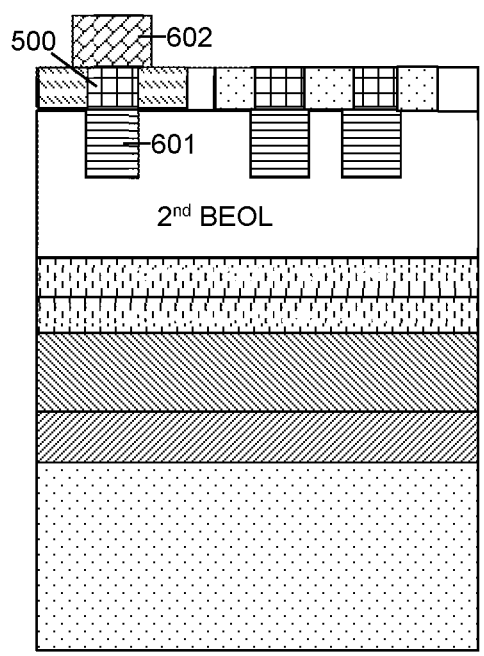

We now refer to FIG. 12. At least one transistor gate 602 is formed opposite an earlier formed transistor gate 601 situated across the common channel material 500.

Figure 13:
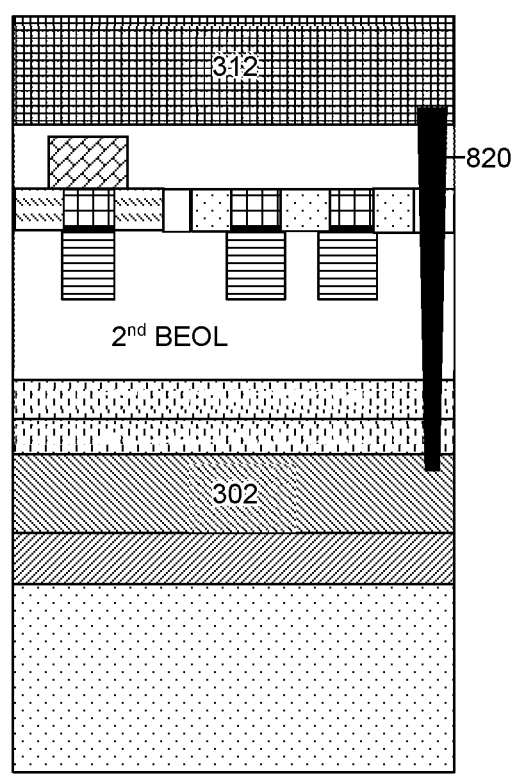

We now refer to FIG. 13. A further BEOL 312 is formed and the first 302 and second 312 BEOL are coupled by a via 820. Vias (not shown) may also be used to couple earlier formed interconnects (see FIG. 7) below the channel material 500 to later formed interconnects above the channel material 500.

It is to be understood that although preferred embodiments, specific constructions and configurations, as well as materials, have been discussed herein for devices according to the present disclosure, various changes or modifications in form and detail may be made without departing from the scope and technical teachings of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

We claim:

1. A structure comprising:
   a host substrate;
   one or more bonding layers on top of the host substrate;
   an entity on the one or more bonding layers, wherein the entity comprises a first and a second transistor on opposite sides of a common layer of channel material, wherein the first and second transistors each comprise a respective gate, wherein the respective gates overlap each other, wherein the first and second transistors share the same source and drain regions, wherein the first and second transistors each have a respective channel defined within a same portion of the common layer of channel material overlapped by the respective gates of the first and second transistors, and wherein the first and second transistors have a first polarity and are connected in parallel; and
   a third and a fourth transistor on a first side of the common layer of channel material, wherein the third and fourth transistors are connected mutually in series, wherein the third and fourth transistors have a second polarity opposite of the first polarity, and wherein the third and fourth transistors are connected in series to the first and second transistors.

2. The structure of claim 1, wherein the respective gates have the same lateral dimensions and are directly opposite each other across the common layer of channel material.

3. The structure of claim 1, wherein the host substrate comprises a semiconductor device.

4. The structure of claim 1, wherein the common layer of channel material is patterned.

* * * * *